United States Patent [19]

Simon

[11] Patent Number: 4,583,079
[45] Date of Patent: Apr. 15, 1986

[54] MULTIPLEXED TRACKING CONVERTER

[75] Inventor: David J. Simon, Glen Rock, N.J.

[73] Assignee: The Singer Company, Little Falls, N.J.

[21] Appl. No.: 561,414

[22] Filed: Dec. 14, 1983

[51] Int. Cl.[4] .............................................. G05B 1/00
[52] U.S. Cl. ............................................. 340/347 SY
[58] Field of Search .................. 340/347 SY; 318/654, 318/655; 364/559, 603

[56] References Cited

U.S. PATENT DOCUMENTS 4,062,005  12/1977  Freed et al. ................. 340/347 SY
4,164,729   8/1979  Simon et al. ................. 340/347 SY
4,468,745   8/1984  Kjosavik ....................... 340/347 SY Primary Examiner—Clifford C. Shaw
Attorney, Agent, or Firm—T. W. Kennedy

[57] ABSTRACT

Multiple input channels, containing servo angle data, undergo analog multiplexing by a single non-linear ladder and switch network which generates a steering voltage on a channel-by-channel basis. The steering voltage undergoes demodulation and digitization for feedback to the multiplexed non-linear network thereby emulating a Type II servo loop. The digitized angle information is also made available as tracking converter outputs.

3 Claims, 3 Drawing Figures

MULTIPLEXED TRACKING CONVERTER

FIELD OF THE INVENTION

This invention relates to synchro-to-digital tracking converters in general and more particularly to means for digitally encoding multiple channels of synchro-analog information through use of a multiplexed tracking converter.

BRIEF DESCRIPTION OF THE PRIOR ART

Synchro-to-digital tracking converters are commonly used to translate analog synchro information to digital binary angle magnitude information, especially in applications requiring high dynamic accuracy, quadrature rejection, and the signal conditioning characteristics of such devices.

Synchro-to-digital tracking converters are used most commonly to accept analog synchro information and translate that information into a digital format which can be understood by a digital computer. The net result of this translation is the ability of a computer to, for example, interrogate a synchro to determine the angular position of its shaft. A tracking converter differs from the other types of converters, i.e., successive approximation and sampling, in that there is no minimum conversion time required to generate the angular information. Furthermore, tracking converters most commonly have a feedback loop which simulates a Type II servo loop, which allows it to track a constantly changing input with no lag errors (the velocity constant approaches infinity until the maximum tracking speed is reached).

Basic to all tracking converters is the ability to accurately generate a steering voltage whose magnitude and phase contain information which causes the Type II control loop to null itself when the digital output angle $\beta$ is representative of the analog input information $\theta$. Most commonly, the steering voltage is proportional to $\sin(\theta-\beta)$ because this expression does null itself as $\theta$ approaches $\beta$.

Most commonly, the function which is actually implemented is the trigonometric expression:

$$\sin(\theta-\beta) = \sin\theta\cos\beta - \cos\theta\sin\beta$$

Sin $\theta$ and cos $\theta$ are given analog inputs to the converter. They are either provided directly, when the inputs are four wire resolver signals, or are generated by standard Scott "T" transformers from three wire synchro inputs. In order to implement the expression, it is necessary to generate information representing sin $\beta$ and cos $\beta$.

The non-linear functions sin $\beta$ and cos $\beta$ are generated from the linear digital output angle $\beta$ by means of an approximation which forms the "heart" of the converter.

Prior state of the art converters most typically generated the sin $\beta$, cos $\beta$ approximation by use of two sets of precision ladder networks and two sets of switches.

The use of two ladder networks and two sets of switches represents duplication of the most costly and critical components in the converter.

U.S. Pat. No. 4,164,729, assigned to the present assignee, improved the art which existed previous thereto by implementing an approximation technique utilizing simplified single ladder circuitry. Although this patent discloses circuitry which is an advance in the art, it would be desirable to achieve multiplexing for multiple channels thereby further lowering costs and circuit complexities.

Although schemes have been employed to multiplex multiple synchro inputs to a single track converter, they have typically suffered from the long settling times required for the Type II control loop to acquire a step change at its input. Known multiplexing schemes have commonly tracked only one input at a time, while the other inputs go unserviced. Since typical 180° step change settling times of 14 to 16 bit resolution converters are on the order of 100 to 300 milliseconds, these staleness errors are usually too large for use in dynamic systems. Techniques have been employed to reduce large signal settling time by use of coarse resolution slewing/fine resolution tracking. However, despite considerable cost and component complexity, the settling times remain in the order of 20 to 50 milliseconds.

BRIEF DESCRIPTION OF THE PRESENT INVENTION

The present invention provides a means of digitally encoding multiple channels of synchro angle information through use of a multiplexed tracking converter utilizing steering voltage circuitry as set forth in the previously mentioned patent. Also, a multiple of Type II control loops are used to maintain the desired dynamic accuracy and signal conditioning for each tracked channel. Each control loop is also of the type disclosed in the aforementioned patent. Thus, it is not the particular steering voltage circuitry or control loop presently employed which is the crux of the invention. Rather, it is the concept of multiplexing such circuitry with multiple control loops. In fact, the multiplexing concept of the present invention is utilizeable regardless of the particular type of approximation technique employed.

The ability to multiplex the disproportionally expensive and complex steering voltage circuitry results in substantial cost and performance advantages.

Use of individual Type II control loops eliminates large signal settling time restrictions encountered when use of one multiplex control loop is considered. Each Type II control loop becomes part of a sampled data system which still allows the digital output $\beta$ to track a constantly changing analog input $\theta$ without lag errors.

The above-mentioned objects and advantages of the present invention will be more clearly understood when considered in conjunction with the accompanying drawings, in which:

DETAILED DESCRIPTION OF THE INVENTION

Figure 1:
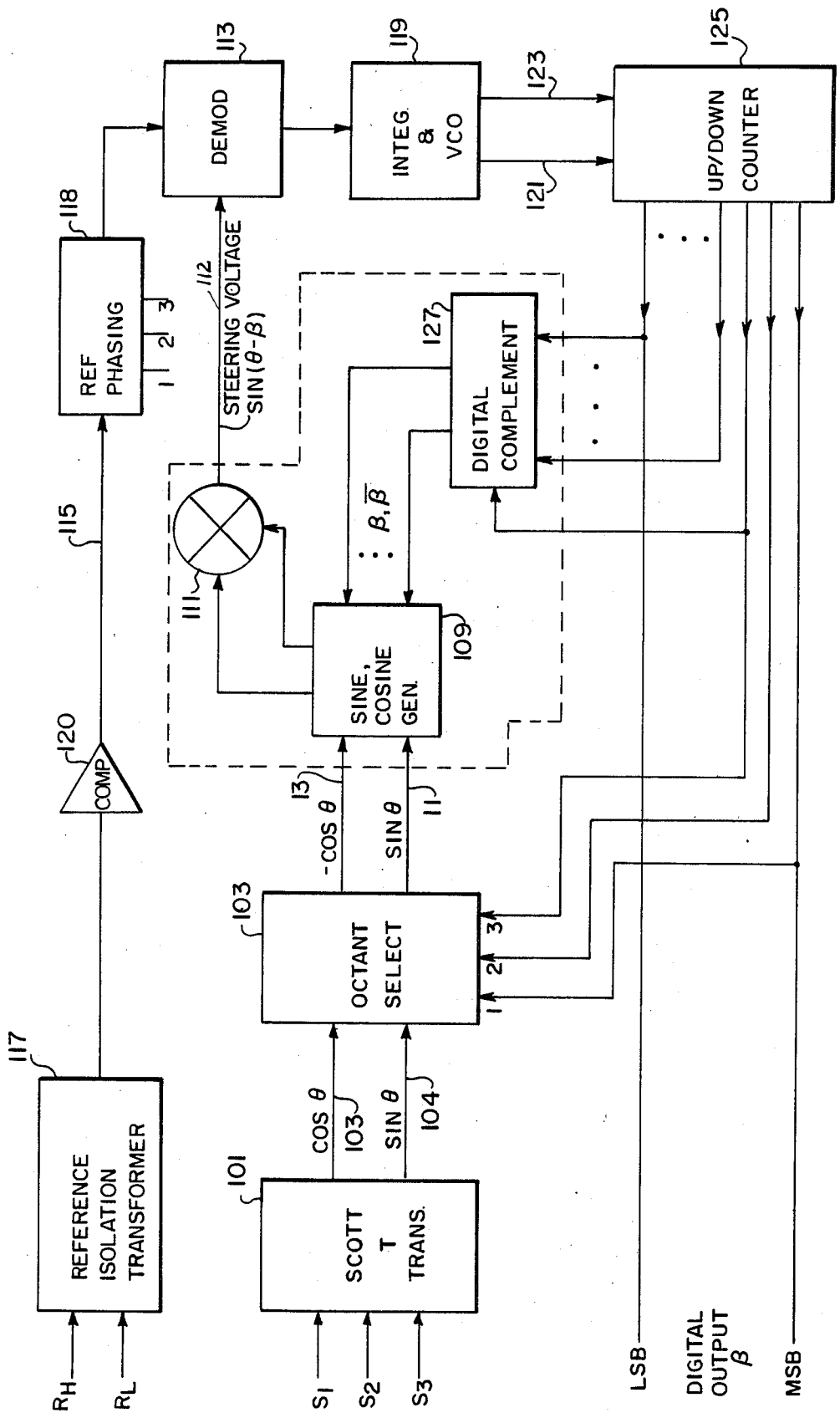
FIG. 1 is a block diagram of a prior art single channel track converter.

FIG. 1 herein is identical to the overall block diagram of FIG. 3 in the aforementioned patent and will be described. In order to maintain consistency, reference numerals identical with those used in the previous patent will be used in the discussion of present FIG. 1.

Assuming that the input is from a synchro rather than a resolver, the synchro outputs $S_1$, $S_2$ and $S_3$ are provided to Scott "T" transformer 101, the output of which will be cos $\theta$ and sin $\theta$ on lines 103 and 104, respectively. These outputs are coupled to an octant selection module 103 providing an output $-\cos \theta$ signal on line 13 and a sin $\theta$ signal on line 11. These form inputs to a sine/cosine generator 109, the primary purpose of the octant select circuit being to maintain opposite phasing between sin $\theta$ and cos $\theta$ in any given octant. The output of the sine/cosine generator 109 is coupled into a summer 111 which takes the difference of $\theta$ and $\beta$, $\theta$ being the analog angle from the synchro and $\beta$ being the digital angle. This output is coupled into a demodulator 113 having a reference input on line 115 obtained from a reference isolation transformer 117, through a comparator 120 which converts it to a square wave. The sin $(\theta - \beta)$ signal is demodulated and forms an input to an integrator and voltage controlled oscillator unit 119. This module provides two outputs, a clock signal and a directional signal, respectively, on lines 121 and 123. These are inputs to an up-down counter 125. The output of the up-down counter 125 is the digital angle $\beta$. The third through nth. bits thereof are coupled into a digital complement module 127, the output of which is the input angle $\beta$ to the sine/cosine generator 109. The third bit is the complement bit. In other words, when that bit is absent, the digital angle is coupled through directly and when that bit is present, the complement of the angle is coupled through. The third bit is the 45° bit and thus complementing takes place in every other octant.

In general terms, in operation the sine/cosine generator 109 and the summing means 111 generate an error signal representative of the error between the actual angle $\theta$ and the digital output and $\beta$. This error is demodulated in the demodulator 113 and provided to the integrator in the VCO unit 119. The integrator adjusts itself in accordance with the error, the output of the integrator driving the voltage controlled oscillator. The output of the voltage controlled oscillator in turn increments the counter up and down to bring the angle $\beta$ into agreement with the angle $\theta$.

Because the only constraint on the octant select circuit is to maintain opposite phasing between sin $\theta$ and cos $\theta$ in the same octants, a positive error or steering voltage would indicate a "positive" angular error, in other octants the same voltage would indicate a "negative" error. This would seemingly indicate that the phasing of the steering voltage was not containing the correct information. This phase information is interpreted by the phase sensitive demodulator 113 of FIG. 1, which is referenced by the phase of the reference voltage. The phasing of the reference voltage is changed versus the octant so that the phasing information of the steering voltage is always correctly interpreted by the phase sensitive demodulator by a reference phase module 118. The steering voltage is used to provide the required magnitude and phasing information to the feedback loop illustrated in FIG. 1, which typically simulates a Type II servo loop.

Thus the phase sensitive demodulator 113 generates a polarity sensitive d-c voltage from the steering voltage on line 112. This d-c voltage is integrated by a conventional operational amplifier integrator in block 119. The appropriate loop frequency stabilization can be incorporated into the same operational amplifier. The output is fed into a voltage controlled oscillator also in VCO unit 119, which generates pulses at the appropriate frequency and which is used to increment the up-down counts in the appropriate direction. The output of the counter 125 contains the output angle $\beta$ which is used to control the ladder network in generator 109 generating the steering voltage. This circuitry displays the capability of maintaining a null for the steering voltage even when the counter is being rapidly changed, i.e., when the converter is tracking a constantly changing input.

A more detailed description of the block diagram is furnished in U.S. Pat. No. 4,164,729 and is incorporated herein by reference.

Figure 2:
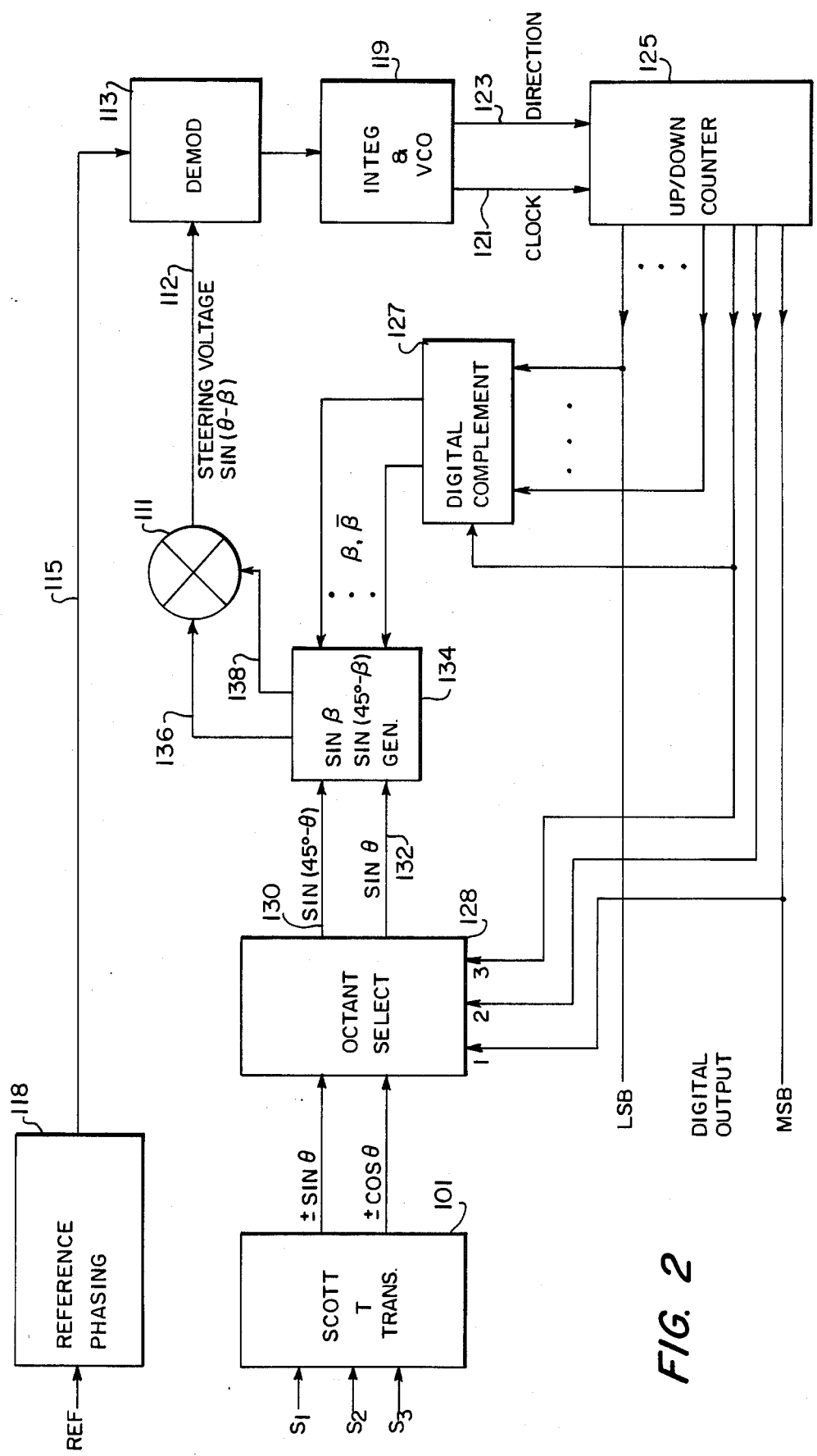
FIG. 2 is a block diagram of an alternate embodiment of a single channel tracking converter.

FIG. 2 shows an alternate embodiment of a tracking converter utilizing a different approximation technique. Identical reference numerals are used to denote identical components. As opposed to the octant selector circuit 103 of FIG. 1, the structurally similar octant select circuit 128 produces the signal sin $(45° - \theta)$ on line 130 as contrasted with $-\cos \theta$ produced from the previously described octant select circuit 103, on line 13 (FIG. 1). The outputs from the octant select circuit 128 are coupled to a sine function generator 134 which is in the nature of a non-linear ladder network and switches of the type incorporated in the sine/cosine generator 109 (FIG. 1), but with circuit values adjusted to generate the steering voltage signal sin $(\theta - \beta)$ on line 112.

The sine function generator 134 receives signals from the digital complement module 127 in the same fashion as was the case with the sine/cosine generator 109 (FIG. 1). A summer 111 operates upon the sine function signals present on lines 136 and 138 to actually produce the steering voltage signal on line 112.

The steering voltage signal on line 112 serves as a first input to demodulator 113 while the output from reference phase module 118 serves as a second input to the demodulator 113, in a manner identical with that disclosed in connection with FIG. 1. The integration and voltage controlled oscillator unit 119 drives an up-down counter 125 in a manner previously described in connection with FIG. 1. The output from the counter serves as the digital output for the tracking converter and also serves as a means for introducing digital feedback to the digital complement module 127 and the octant select circuit 128. The tracking converter embodiment of FIG. 2 is also similar to the first-described embodiment of FIG. 1 in that they both function as Type II servo loops.

It is to be stressed that the multiplexing concept of the present invention, to be explained hereinafter, is not limited to octant select. Accordingly, the multiplexing scheme is equally applicable to quadrant select. Also, approximation techniques other than those discussed in connection with FIGS. 1 and 2 are applicable.

Figure 3:
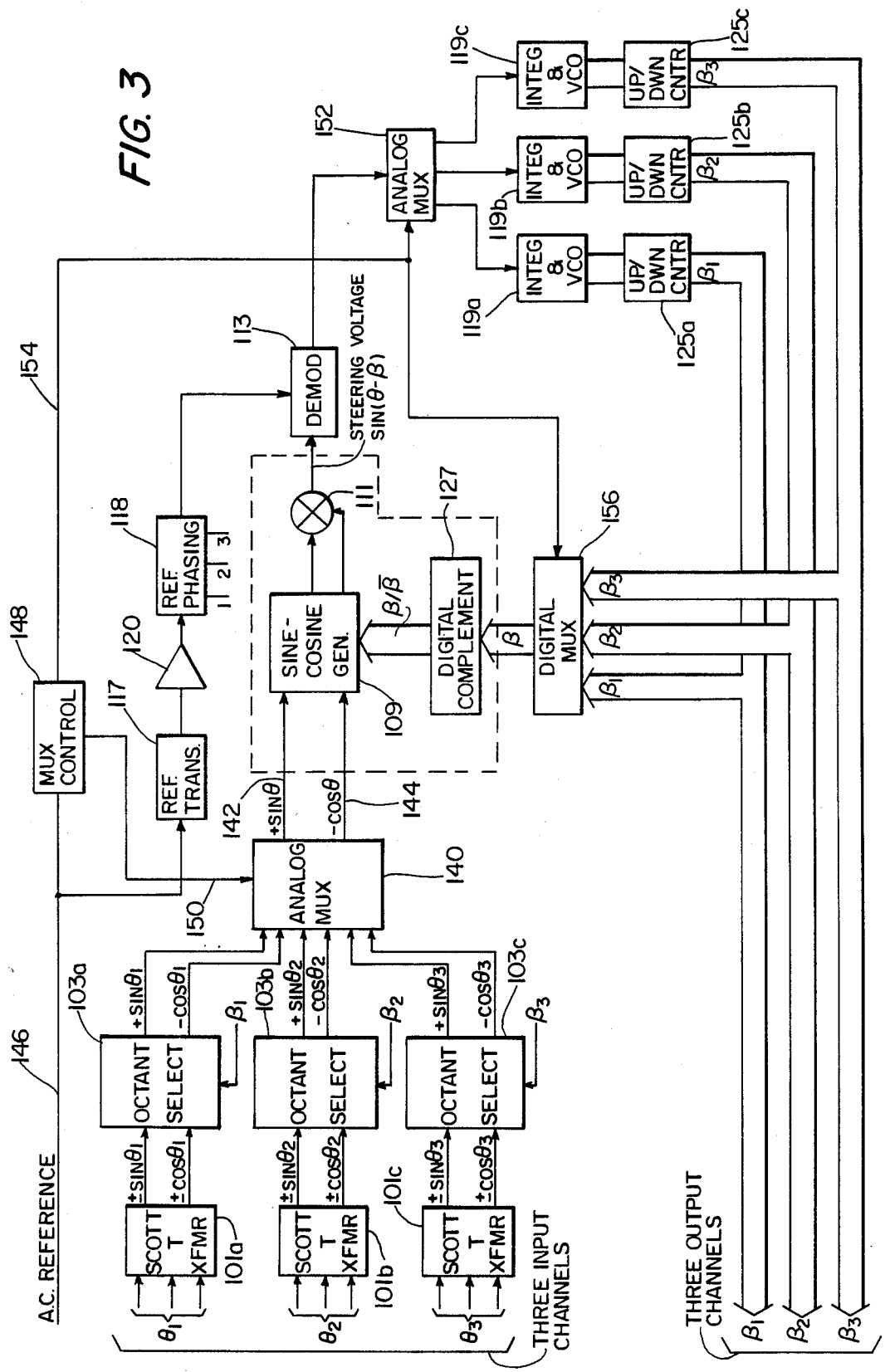
FIG. 3 is a block diagram of the present invention illustrating a multiplexed tracking converter.

FIG. 3 is a block diagram of the invention illustrating the inventive concept of digitally encoding multiple channels of synchro angle information through use of a multiplexed steering voltage circuitry and multiple Type II control loops which maintain the desired dynamic accuracy and signal conditioning for each tracked channel. In the block diagram of FIG. 3, three channels are illustrated. However, it is to be understood that the invention is not so limited and three channels have been selected for purposes of illustration only.

Considering, for example, the first input channel dealing with angular information $\theta_1$, a Scott "T" transformer 101a is seen to accept analog information at its input and produces sin $\theta_1$ and cos $\theta_1$ at its output. The function and operation of transformer 101a is identical to that previously discussed in connection with Scott "T" transformer 101 discussed in connection with FIGS. 1 and 2. The dual output from the Scott "T" transformer is coupled to the input of an octant select circuit 103a which is similar in design and operation to the octant select circuit 103 discussed in connection with FIG. 1. The outputs from the octant select circuit 103a are a positive sine function and negative cosine function of $\theta_1$. As in the case of the octant select circuit 103 of FIG. 1, the digital output angle $\beta_1$, relating to the first channel, is coupled to a second input of the octant select circuit 103. In a preferred embodiment only the three most significant bits of the digital output angle are coupled. As will be seen from FIG. 3, the second and third input channels likewise include respective Scott "T" transformers 101b and 101c as well as corresponding octant select circuits 103b and 103c.

The conventional analog MUX 140 has all of the octant select outputs coupled to its input. On a channel-by-channel basis, the output of the analog MUX will produce signals corresponding to $+\sin\theta$ and $-\cos\theta$ along respective lines 142 and 144. The MUX 140 switches to the outputs of each octant select circuit on a rotating basis as controlled by the MUX control 148 along control line 150. This latter-mentioned circuit has an a-c reference connected to its input, along line 146. The MUX control 148 may simply be a three state ring counter causing the analog MUX 140 to synchronously switch between the octant select circuit outputs. Accordingly, during a first sampling period, the output of analog MUX 140 carries signals $+\sin\theta_1$ and $-\cos\theta_1$. During the next two subsequent sampling periods, similar signals will be generated for $\theta_2$ then $\theta_3$. The MUX control 148 then recycles the analog MUX 140 to accept the signals from the octant select circuit 103a corresponding with the first channel.

At this point in the circuitry, a sine/cosine generator 109, such as previously discussed in connection with FIG. 1, is multiplexed between the three input channels. Alternatively, the generator illustrated and explained in connection with FIG. 2 may be employed if approximation technique functions of $\sin\theta$ and $\sin(45°-\theta)$ are desired. It is critical to understand that circuitry relating to a particular approximation technique is not the invention concept, per se. Rather, it is the utilization of a single circuit for producing a steering voltage by any appropriate approximation technique, on a multiplexed basis as described, which is the inventive concept. Thus, the steering voltage as a function of $\sin(\theta-\beta)$ appears at the output of summer 111 and serves as a first input to full wave demodulator 113. The second input of the demodulator is serially connected to the reference transformer 117, comparator 120 and reference phase module 118, as was the case in connection with FIG. 1. It should be understood that different reference circuits may be utilized to generate a synthetic reference at the second input of demodulator 113. The primary design objective remains the same, namely, the generation of a demodulator output that may be employed by the output circuitry to be discussed, to achieve emulation of a Type II servo loop.

Analog MUX 152 is connected in circuit between the output of demodulator 113 and three output channels of digitizing circuitry, each of which includes an integrator/voltage controlled oscillator such as 119a and an up-down counter 125a, which are configured and operate in a manner previously explained in connection with corresponding circuits 119 and 125 in FIG. 1. Thus, for the first output channel, digital angle information ($\beta_1$) is generated at the output of up-down counter 125a. Likewise, digital angle information $\beta_2$ is produced by integrator/voltage controlled oscillator circuit 119b and up-down counter 125b. Finally, the third digital angle information $\beta_3$ is generated by the serially connected integrator/voltage controlled oscillator 119c and up-down counter 125c. The analog MUX 152 has a control input connected to MUX control 148 and may be considered as three normally opened parallel connected single pole switches which sequentially close one at a time, in synchronism with MUX control 148, to permit the generation at the output of the converter of $\beta_1$ followed by $\beta_2$ and finally $\beta_3$ after which there is a return to $\beta_1$ (the first output channel). MUX 152, in the nature of a simple switch, allows the integrator of each circuit 119a–119c to be configured as an "integrate and hold" amplifier.

Digital MUX 156 is connected to the MUX control 148 so that the MUX inputs are synchronized with the outputs of the corresponding up-down counters 125a, 125b and 125c. The output from digital MUX 156 is connected to the input of a digital complement module 127 identical to the same circuit shown and discussed in connection with FIG. 1. Digital angle information $\beta$ and its complement, on a channel-by-channel basis, forms a second input to the sine/cosine generator 109 thereby completing a Type II servo loop.

It should be understood that the invention is not limited to the exact details of construction shown and described herein for obvious modifications will occur to persons skilled in the art.

I claim:

1. A multiplexed tracking converter comprising:

a plurality of input channels, each carrying information of a corresponding input analog angle;

first analog multiplexing means connected at its input to the input channels for sampling the channels;

means connected at its input to the output of the multiplexing means for generating a steering voltage signal for each channel;

means connected at its input to the output of the steering voltage generating means for producing demodulation of the steering voltage signal;

means connected to the output of the demodulating means for integrating and holding the demodulated steering voltage signal of each channel;

means connected to the output of the integrating and holding means for digitally converting each sampled voltage to digital input angles corresponding to the input analog; and digital multiplexing means for feeding back each digital angle to the steering voltage generating means, thus completing a Type II servo loop for nulling the steering voltage and achieving tracking of the input substantially free of lag error, wherein the sampling and holding means comprises:

a second analog means connected to the output of the demodulating means for multiplexing the demodulated output into a plurality of channels equal to those of the input channels and corresponding to the steering voltage for each input channels;

means for individually integrating the multiplexed demodulated output channels;

means connected to the output of each integrated channel for generating oscillations from respective integrated voltage levels, corresponding to the steering voltage for each input channel; and individual counting means connected to the output of each oscillating means for producing digital counts corresponding to the steering voltage of each input channel and representing respective digital angle equivalents of the input angles, wherein an input of the digital multiplexing means is connected to the counting means for feeding back digital angle information; and wherein the steering voltage generating means comprises a non-linear switched ladder network for carrying out a preselected servo approximation technique.

2. The circuitry of claim 1 together with means connected to the first and second analog multiplexing means as well as the digital multiplexing means for synchronizing the switching of each from one channel to the next.

3. The circuitry of claim 2 wherein each input channel comprises:

a Scott "T" transformer connected at its input to analog angle inputs; and an octant select circuit having a first input connected to the output of a corresponding Scott "T" transformer, a second input thereof connected to a respective digital angle signal, the output of the octant select circuit being connected to the input of the first analog multiplexing means.

* * * * *